United States Patent
Terwilliger et al.

(10) Patent No.: US 9,426,920 B2
(45) Date of Patent: *Aug. 23, 2016

(54) TOP ACCESSIBLE DISK DRIVE CARRIER FOR HORIZONTALLY MOUNTED HARD DRIVE

(71) Applicant: Dell Products, LP, Round Rock, TX (US)

(72) Inventors: Kevin Terwilliger, Austin, TX (US); Richard A. Crisp, Austin, TX (US); Austin J. Orand, Austin, TX (US); Garrett R. Lewis, Austin, TX (US); Paul Kramer, Austin, TX (US)

(73) Assignee: Dell Products, LP, Round Rock, TX (US)

(*) Notice: Subject to any disclaimer, the term of this patent is extended or adjusted under 35 U.S.C. 154(b) by 291 days.

This patent is subject to a terminal disclaimer.

(21) Appl. No.: 14/107,846

(22) Filed: Dec. 16, 2013

(65) Prior Publication Data

US 2014/0104780 A1    Apr. 17, 2014

Related U.S. Application Data

(63) Continuation of application No. 13/281,193, filed on Oct. 25, 2011, now Pat. No. 8,611,093.

(51) Int. Cl.
*H05K 7/14* (2006.01)
*G11B 33/12* (2006.01)

(52) U.S. Cl.
CPC ............ *H05K 7/1401* (2013.01); *G11B 33/12* (2013.01); *G11B 33/128* (2013.01)

(58) Field of Classification Search
CPC .................................. H05K 7/14; H05K 7/18

USPC ....................... 361/727, 137, 679.37; 221/26
See application file for complete search history.

(56) References Cited

U.S. PATENT DOCUMENTS

| | | |
|---|---|---|
| 5,588,728 A | 12/1996 | Eldridge et al. |
| 6,600,656 B1 | 7/2003 | Mori et al. |
| 6,853,549 B2 | 2/2005 | Xu |
| 7,193,856 B2 | 3/2007 | Hidaka |
| 7,200,008 B1 | 4/2007 | Bhugra |
| 7,272,012 B2 | 9/2007 | Salinas et al. |
| 7,280,352 B2 | 10/2007 | Wilson et al. |
| 7,362,566 B1 | 4/2008 | Sivertsen |
| 7,379,303 B2 | 5/2008 | Miyamura et al. |
| 7,382,608 B2 | 6/2008 | Chen et al. |
| 7,583,507 B2* | 9/2009 | Starr .................. G11B 33/128 361/725 |
| 7,742,292 B1* | 6/2010 | Chong, Jr. .......... H05K 7/1489 206/701 |
| RE41,514 E | 8/2010 | Behl et al. |

(Continued)

*Primary Examiner* — Dion R Ferguson
*Assistant Examiner* — Mandeep S Buttar
(74) *Attorney, Agent, or Firm* — Larson Newman, LLP

(57) ABSTRACT

A disk drive carrier includes a frame and a shuttle. The frame includes supports configured to be in physical communication with a disk drive, a first index tab to align the disk drive with a connector on a backplane of a server tray, and an arm configured to engage the disk drive with the connector in a horizontal orientation. The shuttle includes a base including a channel, edges extending from the base and forming an enclosure to receive the frame and the disk drive in a vertical orientation, a fastener connected to the server tray through the channel, and an alignment key configured to slide along the first index tab and to align the disk drive with the connector. The disk drive shuttle is configured to horizontally move along the server tray and to enable the disk drive to connect with the connector in the horizontal orientation.

19 Claims, 7 Drawing Sheets

(56) References Cited

U.S. PATENT DOCUMENTS

| | | |
|---|---|---|
| 8,009,416 B2 | 8/2011 | Kang et al. |
| 8,199,511 B2 * | 6/2012 | Kim ............... H05K 7/1461 |
| | | 312/223.1 |
| 8,385,076 B2 | 2/2013 | Peng et al. |
| 8,475,214 B2 | 7/2013 | Shtargot et al. |
| 2003/0193781 A1 | 10/2003 | Mori |
| 2013/0098853 A1 | 4/2013 | Terwilliger et al. |

* cited by examiner

TOP ACCESSIBLE DISK DRIVE CARRIER FOR HORIZONTALLY MOUNTED HARD DRIVE

CROSS REFERENCE TO RELATED APPLICATIONS

This application is a continuation of U.S. patent application Ser. No. 13/281,193, entitled "Top Accessible Disk Drive Carrier for Horizontally Mounted Hard Drive," filed on Oct. 25, 2011, the disclosure of which is hereby expressly incorporated by reference in its entirety.

FIELD OF THE DISCLOSURE

This disclosure generally relates to information handling systems, and more particularly relates to a top accessible disk drive carrier for a horizontally mounted hard drive.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

An information handling system, such as a server, can include a number of server trays. The server trays can hold multiple disk drives, which are typically either accessible from the front of the server tray or from the top of the server tray. The disk drives that are accessed via the front of the server tray are typically connected to a backplane of the server tray in a horizontal orientation, such that the disk drive translates horizontally along the server tray to connect with the backplane. The disk drives that are accessed via the top of the server tray are typically connected to the backplane of the server tray in a vertical orientation, such that the disk drive translates vertically along the server tray to connect with the backplane.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Figure 1:
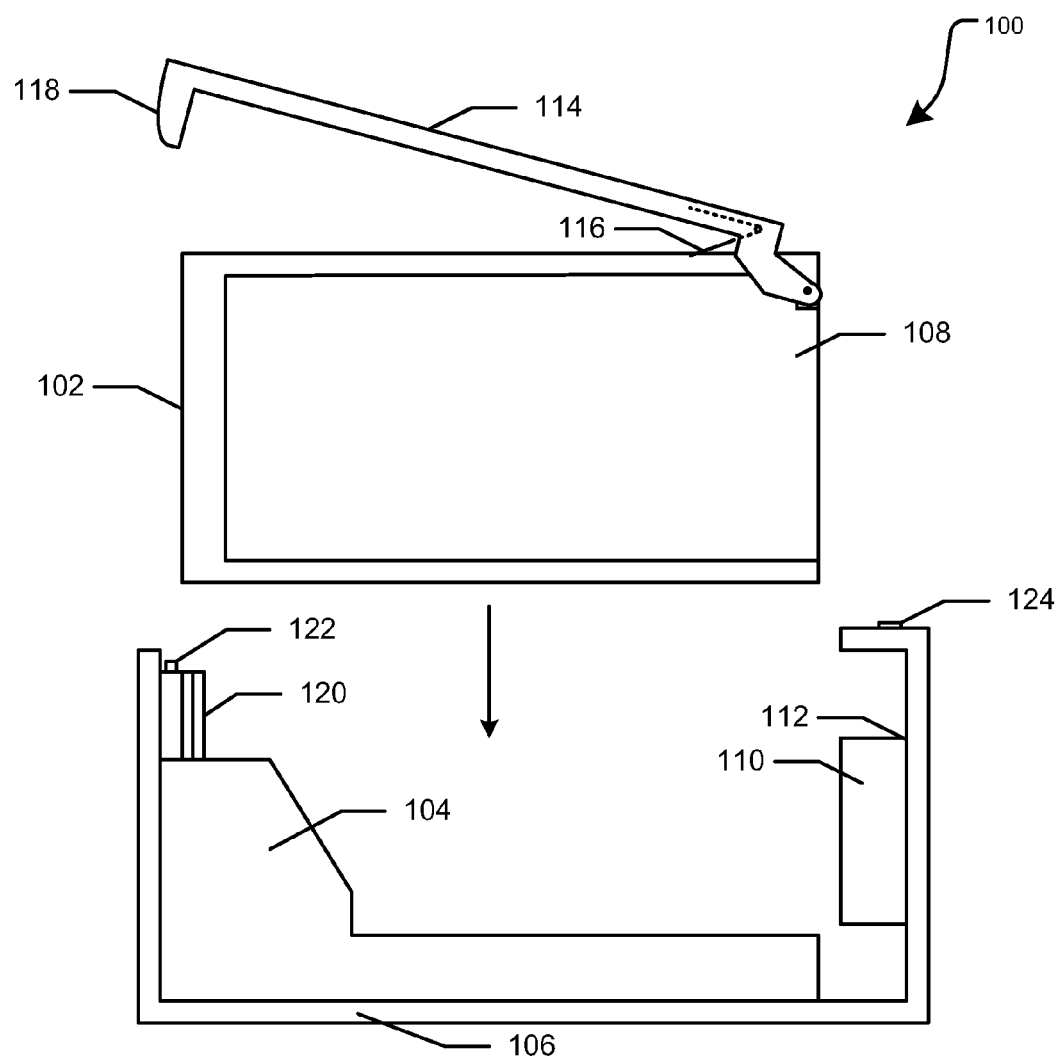
FIG. 1 is a diagram illustrating a disk drive carrier and a server tray.

FIG. 1 shows a disk drive carrier 100 for an information handling system. For purposes of this disclosure, the information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

Figure 2:
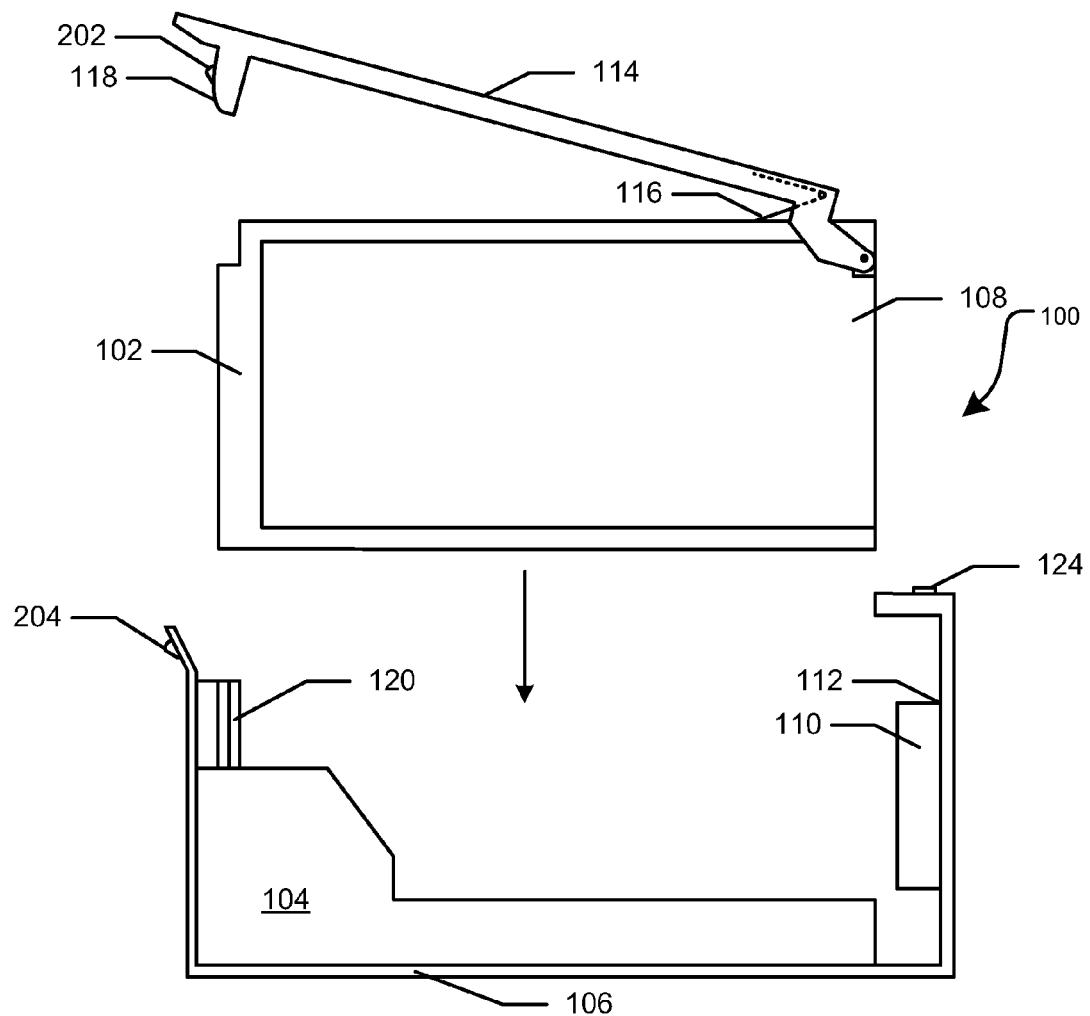
FIG. 2 is a diagram of another embodiment of the disk drive carrier and the server tray.

The disk drive carrier 100 includes a frame 102 and a disk drive shuttle 104, which is connected to a server tray 106. The frame 102 can be connected to a disk drive 108. The frame 102 and the shuttle 104 can be utilized to connect the disk drive 108 with a connector 110 on a backplane 112 of the server tray 106. The frame 102 includes an arm 114, which can be biased in an upward position by a spring 116. The arm 114 includes a head 118. The shuttle 104 includes an alignment key 120 and a lock 122. In an embodiment, the lock 122 can be a push/push trigger lock, as shown in FIG. 1, such that the lock 122 can lock and unlock the arm 114 based on a recursive depression of the lock. In another embodiment, the arm 114 may include a knob 202 that can snap fit within a recess 204 of the server tray 106 to create the lock as shown in FIG. 2. The server tray 106 includes a light emitting diode (LED) 124 that can indicate a status of the disk drive 108 connected to the connector 110 of the server tray.

Figure 3:
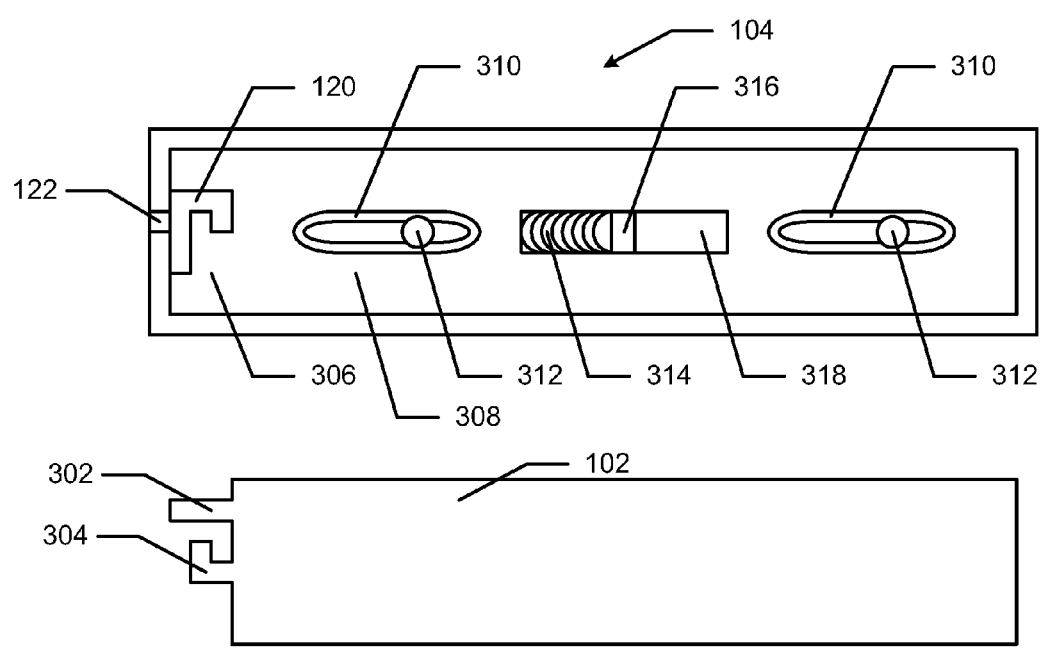
FIG. 3 is a diagram illustrating a top view of a disk drive shuttle and a frame of the disk drive carrier.

FIG. 3 shows the frame 102 having index tabs 302 and 304, and the shuttle 104 having a base 306, edges 308, channels 310, pins 312, a spring 314, a block 316, a channel 318, and the alignment key 120. The pins 312 can be inserted through the channels 310 and can connect the server tray 106. In an embodiment, the pins 312 can be connected to the server tray 106 such that the heads of the pins are loosely placed in contact with the edges of the channels. Therefore, the pins 312 can slide within the channels 310 while the shuttle 104 slides along the server tray 106. The spring 314 and block 316 within the channel 318 can bias the shuttle 104 away from the connector 110 as shown in FIGS. 1 and 2. The indexing tabs 302 and 304 of the frame 102 can slide around the alignment key 120 of the shuttle 104 to properly align the frame 102 and the disk drive 108 within the shuttle.

Figure 4:
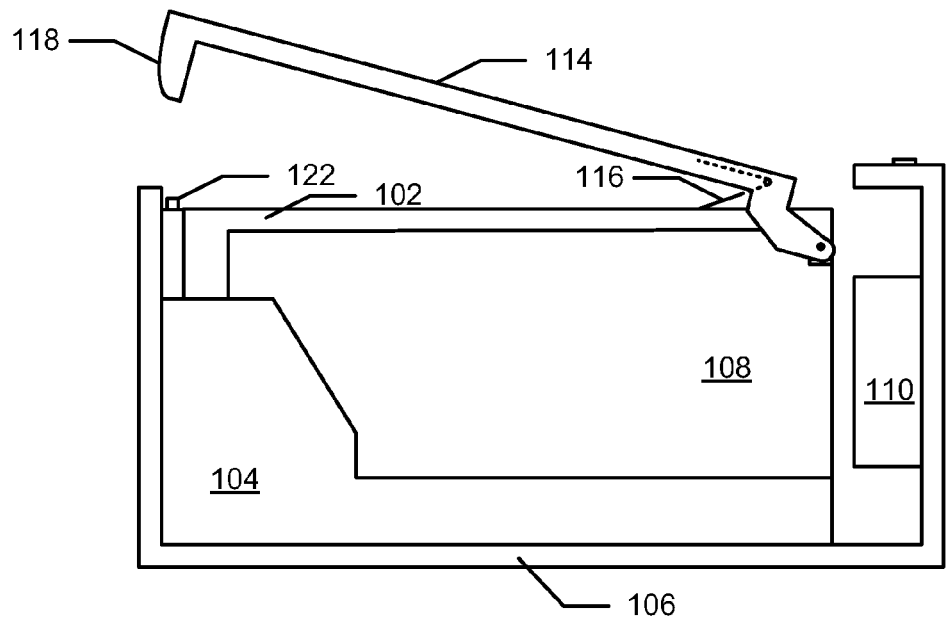
FIG. 4 is a diagram illustrating a disk drive and the frame in a first position within the disk drive shuttle of the disk drive carrier.

The frame 102 and the disk drive 108 can be lowered into the shuttle 104 until the bottom of the frame is in physical communication with the base 306 of the shuttle. At this point, the alignment key 120 can be interlocked with the index tabs 302 and 304, and the disk drive 108 can be aligned with the connector 110 of the server tray 106 as shown in FIG. 4. When the frame 102 and the disk drive 108 are fully inserted into the shuttle 104 in a vertical orientation, a user can press down on the arm 114 and compress the spring 116. A narrow tip portion of the head 118 can then come in contact with the server tray 106 as the arm 114 is pushed downward to the frame 102. As the arm 114 is depressed even further, the portion of the head 118 in contact with the server tray 106 can be wider than the tip, which in turn can exert a horizontal force the shuttle 104 and can cause the shuttle, the frame 102 and disk drive 108 to slid access the server tray 106 toward the connector 110.

Figure 5:
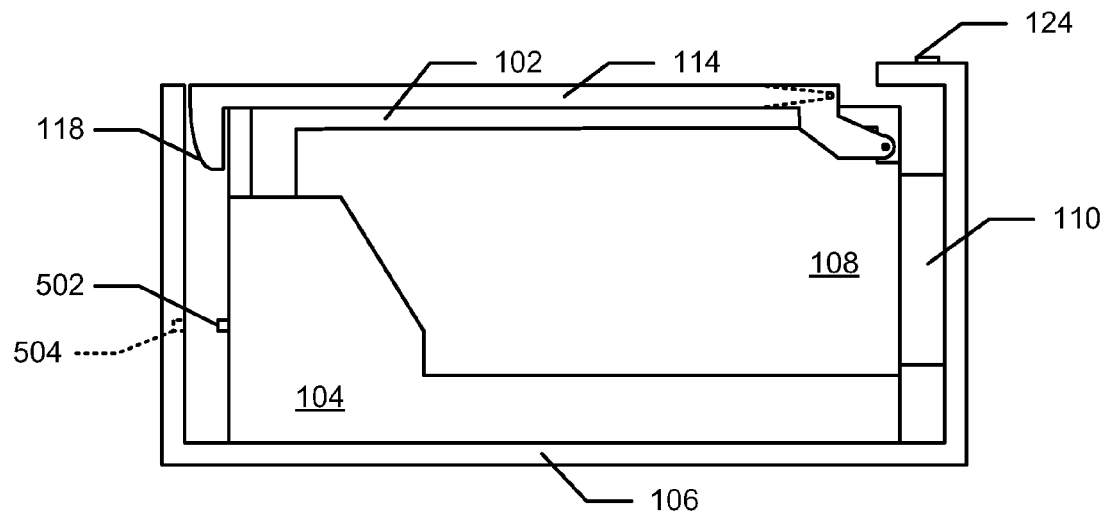
FIG. 5 is a diagram illustrating the disk drive and the frame in a second position within the disk drive shuttle of the disk drive carrier.

When the arm 114 has been pressed down such that the arm the length of the arm is in physical communication with the frame 102, the shuttle 104 can have been guided by the pins 312 and channels 310 and slid enough horizontally so that the disk drive has connected with the connector 110 in a horizontal orientation. The arm 114 can be held in a downward position, as shown in FIG. 5, by the lock 122. In an embodiment, the shuttle 104 can include a knob 502, which can be inserted into a corresponding recess 504 in the server tray 106 when the shuttle is biased away from the connector 110. The knob 502 and the recess 504 can be used to further provide proper alignment of the shuttle 104 with respect to the connector 110.

The arm 114 can be released from the lock 122 by the user pressing down and releasing the arm. When the arm 114 is unlocked from the lock, the spring 116 can force the arm into the upward biased position and the spring 314 can force the shuttle into the biased position away from the connector 110 as shown in FIG. 4. The user can then remove the frame 102 and the disk drive 108 from the shuttle 104 and the server tray 106.

Figure 6:
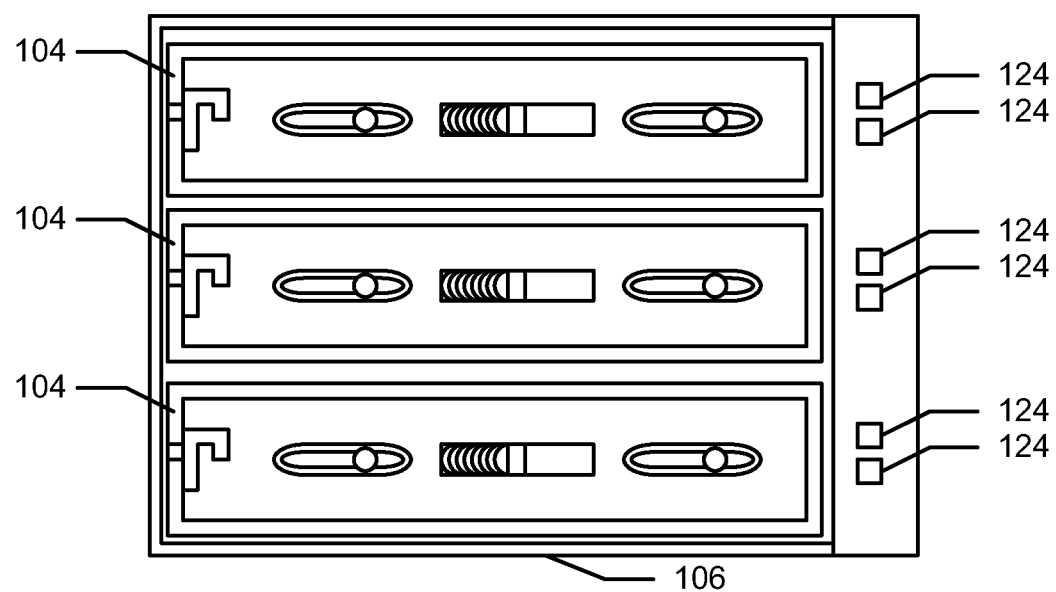
FIG. 6 is a diagram illustrating the server tray including a number of disk drive shuttles.

FIG. 6 shows the server tray 106 including multiple shuttles 106. The layout of the server tray 106 can provide a user with access to the disk drives 108 via the top of the server tray. The shuttles 106 of the server tray 106 can enable the disk drives 108 to be horizontally connected to the connector 110 of the backplane 112 while being accessible for insertion or removal from the top of the server tray. Each of the shuttles 106 can receive a different frame 102 and disk drive 108 as described above. The shuttles 106 can then be utilized to connect the disk drives 108 with the connectors 110 of the server tray 106. When the disk drive 108 has been coupled to the connector 110, the LEDs 124 associated with the connector can be turned on and/or off to indicate a status of the disk drive. In other embodiments, greater or fewer shuttles 104 can be included within the server tray 106.

Figure 7:
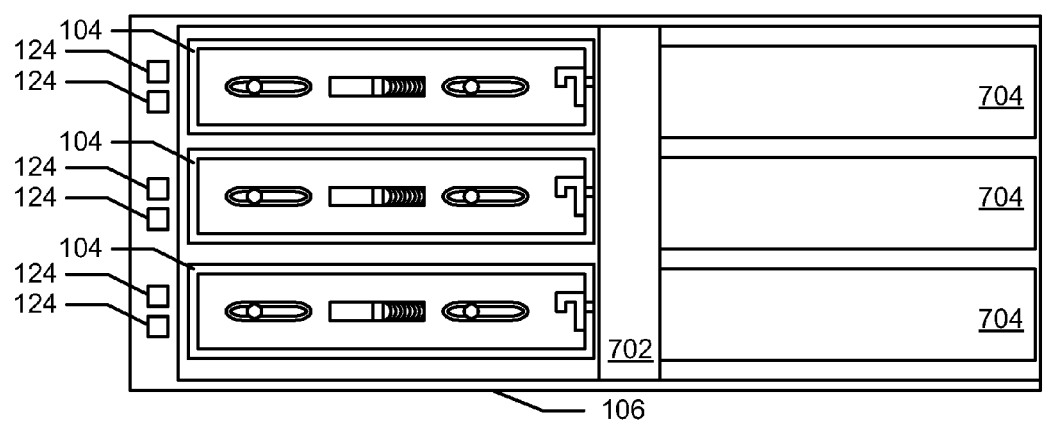
FIG. 7 is a diagram illustrating the server tray including a number of disk drive shuttles and a number of front accessible disk drives.

FIG. 7 shows another embodiment of the server tray 106 including a backplane 702, disk drives 704, the shuttles 106, and the LEDs 124. The disk drives 704 can be front accessible disk drives, such that they can be inserted from the front of the server tray 106, and horizontally connected to the backplane 702. The shuttles 106 can be located behind the backplane 702, such that additional horizontally connected disk drives can be stored in the server tray 106. The shuttles 106 enable the disk drives 108 to be accessible from the top of the server tray 106 while horizontally connecting to the connector 110 as described above. In other embodiments, greater or fewer shuttles 104 and/or disk drives 704 can be included with the server tray 106.

Figure 8:
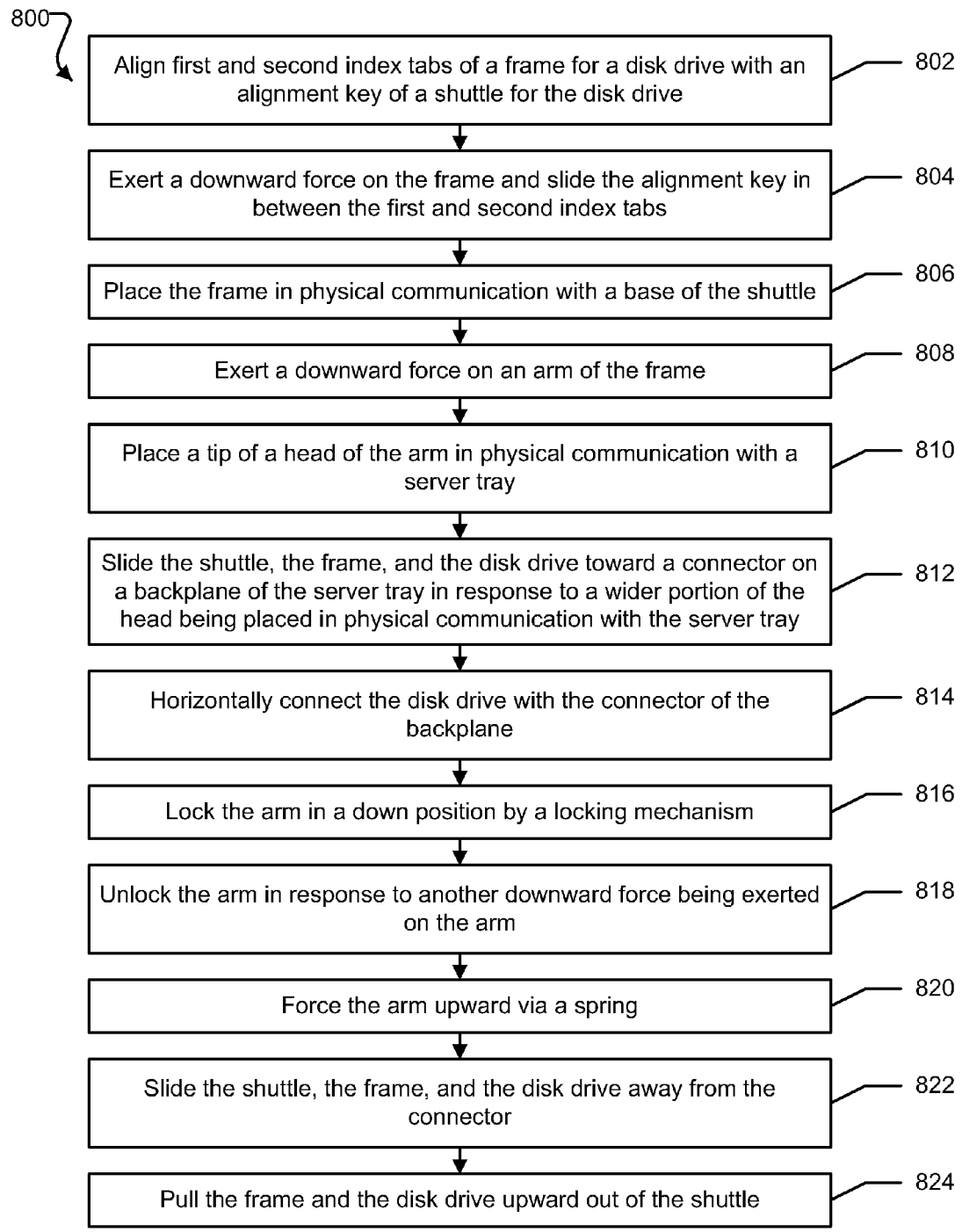
FIG. 8 is a flow diagram of a method for connecting a disk drive to a backplane.

FIG. 8 shows a flow diagram of a method 800 for connecting a disk drive to a backplane of a server tray. At block 802, first and second index tabs of a frame for a disk drive are aligned with an alignment key of a shuttle for the disk drive. A downward force is exerted on the frame and the alignment key is slid in between the first and second index tabs at block 804. At block 806, the frame is placed in physical communication with a base of the shuttle. A downward force is exerted on an arm of the frame at block 808. The downward force on the arm can cause the arm to move toward to a top portion of the frame.

At block 810, a tip of a head of the arm is placed in physical communication with a server tray. The shuttle, the frame, and the disk drive are slid toward a connector on a backplane of the server tray in response to a wider part of the head being placed in physical communication with the server tray at block 812. In an embodiment, the shuttle, the frame, and the disk drive can slide by translating horizontally along to the server tray. At block 814, the disk drive is horizontally connected with the connector of the backplane. The arm is locked in a down position by a lock at block 816. The lock can be a knob on the head that snap fits within a recess of the server tray, can be a mechanical push/push trigger lock, or the like.

At block 818, the arm is unlocked in response to a second downward force exerted on the arm. The arm is forced upward by a spring at block 820. At block 822, the shuttle, the frame, and the disk drive are slid away from the connector on the backplane by another spring and in response to the arm being forced upward. The frame and disk drive is pulled upward out of the shuttle at block 824.

Although only a few exemplary embodiments have been described in detail above, those skilled in the art will readily appreciate that many modifications are possible in the exemplary embodiments without materially departing from the novel teachings and advantages of the embodiments of the present disclosure. For example, the methods described in the present disclosure can be stored as instructions in a computer readable medium to cause a processor to perform the method. Additionally, the methods described in the present disclosure can be stored as instructions in a non-transitory computer readable medium, such as a disk drive, a solid state drive, a flash memory, and the like. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A disk drive frame comprising: a plurality of supports configured to be in physical communication with a disk drive; a first index tab connected to the supports, the first index tab configured to align the disk drive with a connector on a backplane of a server tray; and an arm connected to the supports, the arm configured to engage the disk drive with the connector in a horizontal orientation; and an enclosure of a shuttle, wherein the disk drive and disk drive frame are inserted into the enclosure in a vertical direction from the top of the disk drive frame prior to the disk drive being engaged with the connector on the backplane; and a lock of the shuttle, wherein the lock is configured to hold the shuttle in a first position to enable the disk drive to connect with the backplane.

2. The disk drive frame of claim 1 further comprising:
a spring connected to the arm, the spring configured to basis the arm up from the supports.

3. The disk drive frame of claim 1 further comprising:
a head connected to the arm, the head configured to push the disk drive frame toward the backplane when the head engages the server tray.

4. The disk drive frame of claim 1 further comprising:
a knob on the head, the knob configured to snap fit within a recess of the server tray and to lock the disk drive engaged with the connector.

5. The disk drive frame of claim 1 further comprising:
a second index tab connected to the supports, the second index tab configured to hold the disk drive in a proper alignment with the connector.

6. A disk drive carrier comprising: a frame including: a plurality of supports configured to be in physical communication with a disk drive; a first index tab connected to the supports, the first index tab configured to align the disk drive with a connector on a backplane of a server tray; and an arm connected to the supports, the arm configured to engage the disk drive with the connector in a horizontal orientation; and a shuttle including: an enclosure to receive the frame and the disk drive in a vertical orientation, wherein the shuttle is configured to horizontally move along the server tray and to enable the disk drive to connect with the connector in the horizontal orientation; and an alignment key connected to the enclosure, the alignment key configured to slide along the first index tab and to align the disk drive with the connector; and a lock of the shuttle, wherein the lock is configured to hold the shuttle in a first position to enable the disk drive to connect with the backplane.

7. The disk drive carrier of claim 6, wherein the lock is a push/push trigger lock.

8. The disk drive carrier of claim 6 further comprising:
a spring connected to the enclosure, the spring configured to basis the shuttle in a second position away from the backplane.

9. The disk drive carrier of claim 6 further comprising:
a spring connected to the arm, the spring configured to basis the arm up from the supports.

10. The disk drive carrier of claim 6 further comprising:
a head connected to the arm, the head configured to push the frame, the disk drive, and the shuttle toward the backplane in the horizontal orientation when the head engages the server tray.

11. The disk drive carrier of claim 10 further comprising:
a knob on the head, the knob configured to snap fit within a recess of the server tray and to lock the disk drive engaged with the connector.

12. The disk drive carrier of claim 6 wherein the disk drive is a horizontally mountable disk drive.

13. The disk drive carrier of claim 6 further comprising:
a second index tab connected to the supports, the second index tab configured to hold the alignment key in between the first index tab and the second index tab and to hold the disk drive in a proper alignment with the connector.

14. A disk drive frame comprising: a plurality of supports configured to be in physical communication with a disk drive; and an arm connected to the supports, the arm configured to engage the disk drive with a connector on a backplane of a server tray in a horizontal orientation; an enclosure of a shuttle, wherein the disk drive and disk drive frame are inserted into the enclosure in a vertical direction from the top of the disk drive frame prior to the disk drive being engaged with the connector on the backplane; and a lock of the shuttle, wherein the lock is configured to hold the shuttle in a first position to enable the disk drive to connect with the backplane.

15. The disk drive frame of claim 14 further comprising:
a spring connected to the arm, the spring configured to basis the arm up from the supports.

16. The disk drive frame of claim 14 further comprising:
a head connected to the arm, the head configured to push the disk drive frame toward the backplane when the head engages the server tray.

17. The disk drive frame of claim 14 further comprising:
a knob on the head, the knob configured to snap fit within a recess of the server tray and to lock the disk drive engaged with the connector.

18. The disk drive frame of claim 14 further comprising:
an index tab connected to the supports, the index tab configured to hold the disk drive in a proper alignment with the connector.

19. The disk drive frame of claim 14 wherein the disk drive is a horizontally mountable disk drive.

* * * * *